United States Patent
Yang et al.

(10) Patent No.: US 8,968,984 B2
(45) Date of Patent: Mar. 3, 2015

(54) PHOTOSENSITIVE RESIN COMPOSITION

(75) Inventors: Pil Rye Yang, Yongin-si (KR); Kyung Keun Yoon, Seongnam-si (KR); Yun Jae Lee, Yongin-si (KR)

(73) Assignee: Kolon Industries, Inc., Gwacheon-si (KR)

( * ) Notice: Subject to any disclaimer, the term of this patent is extended or adjusted under 35 U.S.C. 154(b) by 64 days.

(21) Appl. No.: 13/574,354

(22) PCT Filed: Nov. 19, 2010

(86) PCT No.: PCT/KR2010/008212
§ 371 (c)(1),
(2), (4) Date: Jul. 24, 2012

(87) PCT Pub. No.: WO2011/062446
PCT Pub. Date: May 26, 2011

(65) Prior Publication Data
US 2013/0344437 A1  Dec. 26, 2013

(30) Foreign Application Priority Data

Nov. 20, 2009 (KR) .......... 10-2009-0112861
Oct. 29, 2010 (KR) .......... 10-2010-0107219

(51) Int. Cl.
*G03F 7/00* (2006.01)
*G03F 7/028* (2006.01)
(52) U.S. Cl.
CPC ................................. *G03F 7/028* (2013.01)
USPC .......... 430/281.1; 524/599; 252/586; 430/18; 556/400
(58) Field of Classification Search
None
See application file for complete search history.

(56) References Cited

U.S. PATENT DOCUMENTS

2008/0165542 A1* 7/2008 Kim et al. ............. 362/339

FOREIGN PATENT DOCUMENTS

| JP | 2007-256481 A | | 10/2007 |
|---|---|---|---|
| JP | 2008-225162 A | | 9/2008 |
| JP | 2009-86414 A | | 4/2009 |
| JP | 2009-205137 A | | 9/2009 |
| KR | 10-2010-0036568 | * | 4/2010 |
| KR | 10-2010-0036568 | * | 8/2010 |

OTHER PUBLICATIONS

Machine translation of KR 10-2010-0036568, Aug. 2010, pp. 1-15.*
International Searching Authority, International Search Report for PCT/KR2010/008212 dated Aug. 12, 2011.

* cited by examiner

*Primary Examiner* — Susannah Chung
*Assistant Examiner* — Robert T Butcher
(74) *Attorney, Agent, or Firm* — Sughrue Mion, PLLC

(57) ABSTRACT

Disclosed is a photosensitive resin composition for an organic insulating layer. More specifically, the photosensitive resin composition is suitable for forming a substrate of a transflective thin film transistor liquid crystal display (TFT-LCD) or a pattern of an interlayer insulating layer by improving remarkably a pattern property with a high taper angle besides improvement of flatness, sensitivity, heat resistance, and transparency. Particularly, the photosensitive resin composition can provide low power dissipation besides a wide viewing angle and high visibility when being applied to a transflective type display. In addition, the photosensitive resin composition can provide a clear screen under natural light without a backlight by maintaining the brightness of a screen and prominent field visibility.

15 Claims, 1 Drawing Sheet

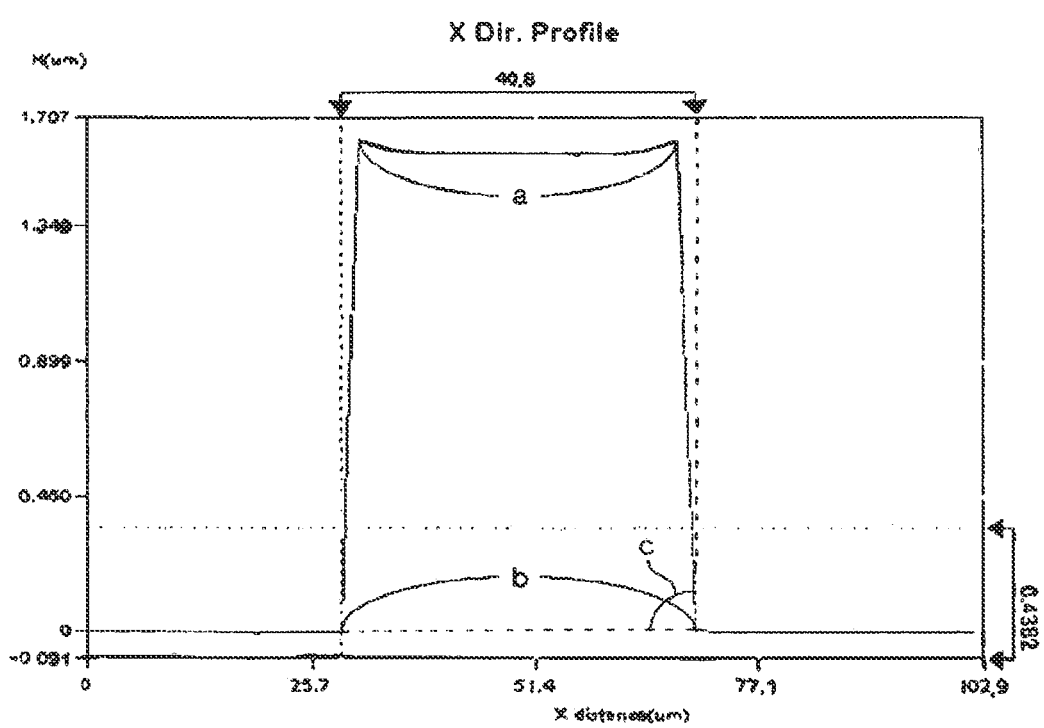

PHOTOSENSITIVE RESIN COMPOSITION

CROSS REFERENCE TO RELATED APPLICATIONS

This application is a 371 Application No. PCT/KR2010/008212 filed Nov. 19, 2010, claiming priority based on Korean Patent Application Nos. 10-2009-0112861 filed Nov. 20, 2009 and 10-2010-0107219 filed Oct. 29, 2010, the contents of all of which are incorporated herein by reference in their entirety.

TECHNICAL FIELD

The present invention relates to a photosensitive resin composition for use in an organic insulating layer.

BACKGROUND ART

TFT-LCD (Thin Film Transistor Liquid Crystal Display) is configured such that a glass substrate having a TFT array and a glass substrate having a color filter are layered at a predetermined interval, and liquid crystals are injected between these two glass substrates to form a panel, to which an electrical signal is then applied, to render a display.

Such LCDs may be classified into reflective, transmissive and transflective types depending on the source of the backlight. A reflective LCD reflects an external light source and uses it as a backlight so that a predetermined reflective sheet is required, whereas a transmissive LCD uses an internal light source as a backlight, namely, uses the light of a backlight unit itself.

A transflective LCD is in the form of a combination of the reflective LCD and the transmissive LCD and uses both the external light source and the internal light source. Because the transflective LCD is provided with both a reflective sheet and a backlight unit, external light reflected by the reflective sheet is used on the one hand and internal light emitted from the backlight unit is used on the other hand.

In the case where the brightness of the LCD is not higher than the peripheral luminous intensity, display performance may decrease due to a difference in contrast ratio. To solve this problem, there are methods of partially using external light by means of a transflective LCD and of increasing the luminance of a transmissive LCD itself. The transflective LCD is advantageous because luminance may increase using external light under bright conditions, but is problematic in that reflective cells which operate in a reflective mode constitute 50% of the total opening area and the efficiency is very low to the extent of less than 5% in a reflective mode, undesirably lowering brightness under dark conditions.

Furthermore, because the properties of external light are different from those of internal light, the difference therebetween has to be controlled over time.

In addition, the method of increasing the luminance of the transmissive LCD itself is illustrated. In this case, power consumption may increase because of using a high-luminance backlight in order to obtain high luminance.

Recently, methods of increasing the transmittance of an internal light source using white pixels have been devised. These methods are advantageous in terms of increasing luminance, but resolution may decrease due to the use of white pixels, and also additional imaging processes are required.

Therefore there is a need to develop a transflective LCD which may sufficiently utilize external light without decreasing resolution, and thus the development of a photosensitive resin composition which facilitates the formation of a pattern is urgently required.

DISCLOSURE

Technical Problem

Accordingly, the present invention has been made keeping in mind the above problems occurring in the related art, and the present invention is intended to provide a photosensitive resin composition for use in an organic insulating layer, which may increase flatness, sensitivity, heat resistance and transparency, and also drastically improve patternability at high taper angle.

Technical Solution

An embodiment of the present invention provides a photosensitive resin composition, comprising [A] an alkali-soluble resin, [B] an acrylic monomer having an ethylenically unsaturated bond, [C] a photopolymerization initiator, [D] a compound represented by Chemical Formula 1 below or a compound represented by Chemical Formula 2 below, and [E] a solvent.

<Chemical Formula 1>

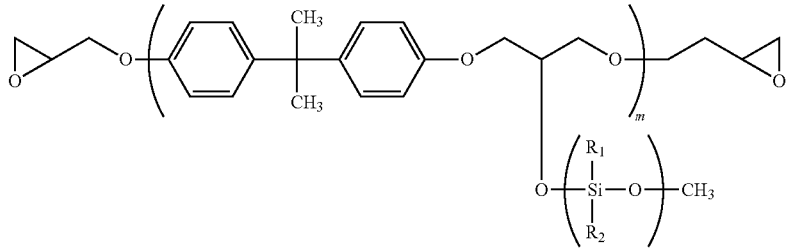

(wherein $R_1$ is a hydrogen atom or a C1~C5 alkyl group, $R_2$ is a hydrogen atom, a C1~C5 alkoxy group or a C1~C5 alkyl group, and m is an integer of 1 to 10.)

<Chemical Formula 2>

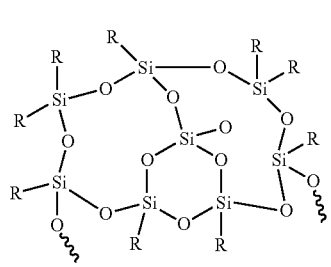

(wherein R is at least one selected from the group consisting of a hydrogen atom, a C1~C10 alkyl group, an alkoxy group, an epoxy group and a hydroxyl group. That is, R may be randomly selected from the group consisting of a hydrogen atom, a C1~C10 alkyl group, an alkoxy group, an epoxy group and a hydroxyl group.)

In the photosensitive resin composition, [D] the compound represented by Chemical Formula 1 or the compound represented by Chemical Formula 2 may have an epoxy equivalent of 500~2000 g/eq.

The photosensitive resin composition may comprise [A] 5~60 wt % of the alkali-soluble resin, [B] 5~70 wt % of the acrylic monomer having the ethylenically unsaturated bond, [C] 0.5~20 wt % of the photopolymerization initiator, [D] 5~70 wt % of the compound represented by Chemical Formula 1 or the compound represented by Chemical Formula 2, and [E] 14~80 wt % of the solvent.

In the photosensitive resin composition, [A] the alkali-soluble resin may be a copolymer of [a1] one or a mixture of two or more selected from among unsaturated carboxylic acid and unsaturated carboxylic anhydride; and [a2] an epoxy-containing unsaturated compound, or may be a copolymer of [a1] one or a mixture of two or more selected from among unsaturated carboxylic acid and unsaturated carboxylic anhydride; [a2] an epoxy-containing unsaturated compound; and one or more selected from among [a3] an olefinic unsaturated carboxylic acid ester compound other than [a1] and [a2], and [a4] an olefinic unsaturated compound other than [a1], [a2] and [a3].

As such, the weight ratio of [a1] the one or the mixture of two or more selected from among unsaturated carboxylic acid and unsaturated carboxylic anhydride and [a2] the epoxy-containing unsaturated compound of [A] the alkali-soluble resin may be 1:1.3~2.5.

Furthermore, in the case where [A] the alkali-soluble resin is a copolymer of [a1] the one or the mixture of two or more selected from among unsaturated carboxylic acid and unsaturated carboxylic anhydride; [a2] the epoxy-containing unsaturated compound; and one or more selected from among [a3] the olefinic unsaturated carboxylic acid ester compound other than [a1] and [a2], and [a4] the olefinic unsaturated compound other than [a1], [a2] and [a3], [A] the alkali-soluble resin may include 20~65 wt % of the one or more selected from among [a3] the olefinic unsaturated carboxylic acid ester compound other than [a1] and [a2], and [a4] the olefinic unsaturated compound other than [a1], [a2] and [a3].

The photosensitive resin composition may have a viscosity of 2~35 cps.

Another embodiment of the present invention provides an organic insulating layer, obtained from the photosensitive resin composition as mentioned above.

A further embodiment of the present invention provides a display device, including the above organic insulating layer.

Advantageous Effects

A photosensitive resin compound according to the present invention can increase flatness, sensitivity, heat resistance and transparency and also can remarkably increase patternability at high taper angle, and is thus useful in forming a pattern of a substrate or an interlayer insulating layer of a transflective TFT-LCD. In particular, when this composition is applied to a transflective display, not only a wide viewing angle and high visibility but also low power consumption can be achieved. In addition, the photosensitive resin composition can provide a clear screen under natural light without using a backlight while maintaining the brightness of a screen and excellent field visibility.

DESCRIPTION OF DRAWING

FIG. 1 illustrates a pattern measured using a 3D profiler according to an embodiment of the present invention.

BEST MODE

According to an embodiment of the present invention, a photosensitive resin composition is provided, which includes [A] an alkali-soluble resin, [B] an acrylic monomer having an ethylenically unsaturated bond, [C] a photopolymerization initiator, [D] a compound represented by Chemical Formula 1 below or a compound represented by Chemical Formula 2 below, and [E] a solvent.

<Chemical Formula 1>

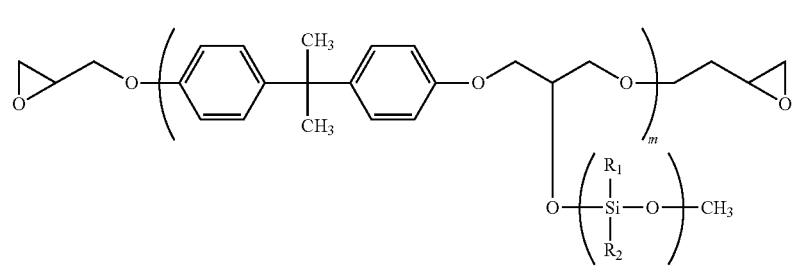

In the above chemical formula, $R_1$ is a hydrogen atom or a C1~C5 alkyl group, $R_2$ is a hydrogen atom, a C1~C5 alkoxy group or a C1~C5 alkyl group, and m is an integer of 1 to 10.

<Chemical Formula 2>

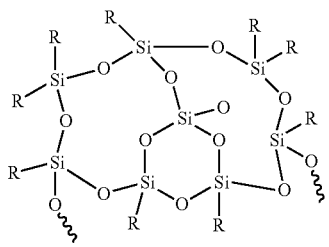

(wherein R is at least one selected from the group consisting of a hydrogen atom, a C1~C10 alkyl group, an alkoxy group, an epoxy group and a hydroxyl group. That is, R may be randomly selected from the group consisting of a hydrogen atom, a C1~C10 alkyl group, an alkoxy group, an epoxy group and a hydroxyl group.)

Below is a detailed description of respective components of the photosensitive resin composition according to an embodiment of the present invention.

[A] Alkali-Soluble Resin

The alkali-soluble resin may be a copolymer of [a1] one or a mixture of two or more selected from among unsaturated carboxylic acid and unsaturated carboxylic anhydride (hereinafter referred to as "mixture a1") and [a2] an epoxy-containing unsaturated compound (hereinafter referred to as "compound a2"), or may be a copolymer resulting from radical polymerization of the mixture a1, the compound a2, and one or more selected from among [a3] an olefinic unsaturated carboxylic acid ester compound (hereinafter referred to as "compound a3") other than [a1] and [a2], and [a4] an olefinic unsaturated compound (hereinafter referred to as "compound a4") other than [a1], [a2] and [a3].

This copolymer is called a copolymer A.

Specific examples of the compound a1 include monocarboxylic acids such as acrylic acid, methacrylic acid, crotonic acid, etc., dicarboxylic acids such as maleic acid, fumaric acid, citraconic acid, mesaconic acid, itaconic acid, etc., and anhydrides of such dicarboxylic acids. Among these, acrylic acid, methacrylic acid, maleic anhydride, etc., are particularly useful in terms of copolymerization reactivity, heat resistance and easy commercial availability. The compound a1 may be used alone or in combination.

The copolymer A usable in the invention contains 5~40 wt % and preferably 10~30 wt % of a constituent unit derived from the compound a1 to ensure heat resistance, chemical resistance, surface hardness and storage stability.

Specific examples of the compound a2 include acrylic acid glycidyl, methacrylic acid glycidyl, α-ethyl acrylic acid glycidyl, α-n-propyl acrylic acid glycidyl, α-n-butyl acrylic acid glycidyl, acrylic acid-3,4-epoxy butyl, methacrylic acid-3,4-epoxy butyl, acrylic acid-6,7-epoxy heptyl, methacrylic acid-6,7-epoxy heptyl, α-ethyl acrylic acid-6,7-epoxy heptyl, o-vinyl benzyl glycidyl ether, m-vinyl benzyl glycidyl ether, p-vinyl benzyl glycidyl ether, etc., which are preferably used to increase copolymerization reactivity, and heat resistance and hardness of the resulting protective layer. The compound a2 may be used alone or in combination.

The copolymer A usable in the invention contains 10~70 wt % and preferably 15~60 wt % of a constituent unit derived from the compound a2 to ensure heat resistance, surface hardness and storage stability of a cured layer.

Specific examples of the compound a3 include methacrylic acid alkyl ester such as methyl methacrylate, ethyl methacrylate, n-butyl methacrylate, sec-butyl methacrylate, t-butyl methacrylate, etc., acrylic acid alkyl ester such as methyl acrylate, isopropyl acrylate, etc., methacrylic acid cycloalkyl ester such as cyclohexyl methacrylate, 2-methyl cyclohexyl methacrylate, dicyclopentenyl acrylate, dicyclopentenyl methacrylate, dicyclopentenyloxyethyl methacrylate, isobornyl methacrylate, etc., acrylic acid cycloalkyl ester such as cyclohexyl acrylate, 2-methyl cyclohexyl acrylate, dicyclopentenyl acrylate, dicyclopentenyloxyethyl acrylate, isobornyl acrylate, etc., methacrylic acid aryl ester such as phenyl methacrylate, benzyl methacrylate, etc., acrylic acid aryl ester such as phenyl acrylate, benzyl acrylate, etc., dicarboxylic acid diester such as maleic acid diethyl, fumaric acid diethyl, itaconic acid diethyl, etc., and hydroxyl alkyl ester such as 2-hydroxy ethyl methacrylate, 2-hydroxy propyl methacrylate, etc. Such a compound a3 may be used alone or in combination.

The copolymer A usable in the invention contains 10~70 wt % and preferably 5~50 wt % of a constituent unit derived from the compound a3 to ensure storage stability, heat resistance, and surface hardness.

Specific examples of the compound a4 include styrene, o-methyl styrene, m-methyl styrene, p-methyl styrene, vinyl toluene, p-methoxy styrene, acrylonitrile, methacrylonitrile, vinyl chloride, vinylidene chloride, acryl amide, methacryl amide, vinyl acetate, 1,3-butadiene, isoprene, 2,3-dimethyl-1,3-butadiene, etc. Particularly useful are styrene, t-butyl methacrylate, dicyclopentenyl methacrylate, p-methoxy styrene, 2-methyl cyclohexyl acrylate, 1,3-butadiene and so on in terms of copolymerization reactivity and heat resistance. Such a compound a4 may be used alone or in combination.

The copolymer A usable in the present invention contains 5~70 wt %, and preferably 5~60 wt % of a constituent unit derived from the compound a4 to attain heat resistance, chemical resistance, surface hardness and storage stability.

The copolymer A preferably includes the mixture a1 and the compound a2 at a weight ratio of 1:1.3~2.5 in order to obtain pattern developability, stability, heat resistance and surface hardness.

In the case where the copolymer A is obtained by polymerizing the mixture a1, the compound a2 and one or more selected from among the compounds a3 and a4, this copolymer A preferably contains 20~65 wt % of one or more selected from among the compounds a3 and a4. When a copolymer obtained via radical polymerization of one or more selected from among the compounds a3 and a4 is contained in the above range, pattern developability, heat resistance, and surface hardness may be favorably increased.

The solid content of the alkali-soluble resin is 10~70 wt % and preferably 20~60 wt %. If the solid content thereof is less than 10 wt %, it is difficult to control the storage stability of the copolymer A and to adjust the polymerization upon preparation of a polymer including all of [a1] to [a4], undesirably yielding a solid. In contrast, if the solid content thereof is greater than 70 wt %, developability, heat resistance, and surface hardness of the copolymer A may decrease.

The alkali-soluble resin is contained in an amount of 5~60 wt % and preferably 10~60 wt % in the photosensitive resin composition. When the amount of the alkali-soluble resin falls in the above range, appropriate developing effects may be attained.

The copolymer A resulting from the compounds a1, a2, a3 and a4 has a carboxylic group or a carboxylic anhydride group and an epoxy group, and may be easily hardened using heating even without the use of a special curing agent.

A solvent used in synthesis of the copolymer A preferably includes alcohol such as methanol, ethanol, etc., ether such as tetrahydrofuran, diethyleneglycol dimethylether, diethyleneglycol diethylether, etc., and propyleneglycol alkyl ether acetate such as propyleneglycol methyl ether acetate, propyleneglycol ethyl ether acetate, propyleneglycol propyl ether acetate, propyleneglycol butyl ether acetate, etc.

A polymerization initiator usable in synthesis of the copolymer A may be a typical radical polymerization initiator. Examples thereof include azo compounds such as 2,2'-azobis isobutyronitrile, 2,2'-azobis-(2,4-dimethylvaleronitrile), 2,2'-azobis-(4-methoxy-2,4-dimethylvaleronitrile), etc., organic peroxides and hydrogen peroxides such as benzoyl peroxide, t-butyl peroxypivalate, 1,1'-bis-(t-butyl peroxy)cyclohexane, etc. When a peroxide is used as the radical polymerization initiator, it may be utilized as a redox initiator along with a reducing agent.

[B] Acrylic Monomer Having Ethylenically Unsaturated Bond

The acrylic monomer having the ethylenically unsaturated bond may include a multifunctional acrylic monomer having one or more ethylenically unsaturated bonds. A monofunctional, bifunctional, trifunctional or higher functional (meth)acrylate is preferable as the multifunctional acrylic monomer of the invention in terms of polymerizability, and heat resistance and surface hardness of the obtained protective layer.

Examples of the monofunctional (meth)acrylate may include 2-hydroxy ethyl(meth)acrylate, carbitol(meth)acrylate, isobornyl(meth)acrylate, 3-methoxy butyl(meth)acrylate, and 2-(meth)acryloyloxyethyl 2-hydroxy propyl phthalate.

Examples of the bifunctional (meth)acrylate include ethyleneglycol(meth)acrylate, 1,6-hexanediol(meth)acrylate, 1,9-nonanediol(meth)acrylate, propyleneglycol(meth)acrylate, tetraethyleneglycol(meth)acrylate, bisphenoxy ethylalcohol fluorene diacrylate, polyethyleneglycolacrylate (number of ethyleneglycol repeating units=3~40), polyethyleneglycolmethacrylate (number of ethyleneglycol repeating units=3~40), polybutyleneglycolacrylate (number of butyleneglycol repeating units=3~40), polybutyleneglycolmethacrylate (number of butyleneglycol repeating units=3~40), etc.

Examples of the trifunctional or higher functional (meth)acrylate include trishydroxyethyl isocyanurate tri(meth)acrylate, trimethylpropane tri(meth)acrylate, pentaerythritol tri(meth)acrylate, pentaerylthritol tetra(meth)acrylate, dipentaerylthritol hexa(meth)acrylate, etc.

The acrylic monomer having the ethylenically unsaturated bond is contained in an amount of 5~70 wt % in the photosensitive resin composition. The case where the amount of the acrylic monomer having the ethylenically unsaturated bond falls in the above range may result in high hardness.

[C] Photopolymerization Initiator

In the present invention, the photopolymerization initiator is a compound that causes decomposition or bonding via photo-exposure and generates active species able to initiate the polymerization of [B] the acrylic monomer having the ethylenically unsaturated bond, such as radicals, anions, cations, etc.

Examples of the photopolymerization initiator include ketones such as Irgacure 907, Irgacure 369, Irgacure ox01, Irgacure 242, thioxantone, 2,4-diethyl thioxantone, thioxantone-4-sulfonic acid, benzophenone, 4,4'-bis(diethylamino) benzophenone, acetophenone, p-dimethylaminoacetophenone, α,α'-dimethoxyacetoxy benzophenone, 2,2'-dimethoxy-2-phenylacetophenone, p-methoxyacetophenone, 2-methyl[4-(methylthio)phenyl]-2-morpholine-1-propanone, 2-benzyl-2-diethylamino-1-(4-morpholinophenyl)-butan-1-one, 2-hydroxy-2-methyl-1-phenylpropan-1-one, 4-(2-hydroxyethoxy)phenyl-(2-hydroxy-2-propyl)ketone, 1-hydroxycyclohexyl phenylketone, etc., quinones such as anthraquinone, 1,4-naphthoquinone, etc., halogen compounds such as 1,3,5-tris (trichloromethyl)-s-triazine, 1,3-bis(trichloromethyl)-5-(2-chlorophenyl)-s-triazine, 1,3-bis(trichlorophenyl)-s-triazine, phenacyl chloride, tribromomethylphenylsulfone, tris (trichloromethyl)-s-triazine, etc., peroxides such as di-t-butyl peroxide, etc., and acyl phosphine oxides such as 2,4,6-trimethyl benzoyl diphenyl phosphine oxide. In the present invention, the photopolymerization initiator may be used alone or in combination.

The photopolymerization initiator may be contained in an amount of 0.5~20 wt % in the photosensitive resin composition. If the amount of the photopolymerization initiator is less than 0.5 wt %, sensitivity of the protective layer is not sufficient, undesirably facilitating the loss of the protective layer in the developing process. Also even when the protective layer is maintained in the developing process, it is difficult to obtain a protective layer having sufficiently high crosslinking density. In contrast, if the amount of the photopolymerization initiator is greater than 20 wt %, it is easy to lower heat resistance, flatness and the like of the protective layer.

[D] Compound Represented by Chemical Formula 1 or Compound Represented by Chemical Formula 2

The photosensitive resin composition according to the present invention includes the compound represented by Chemical Formula 1 below or the compound represented by Chemical Formula 2 below.

<Chemical Formula 1>

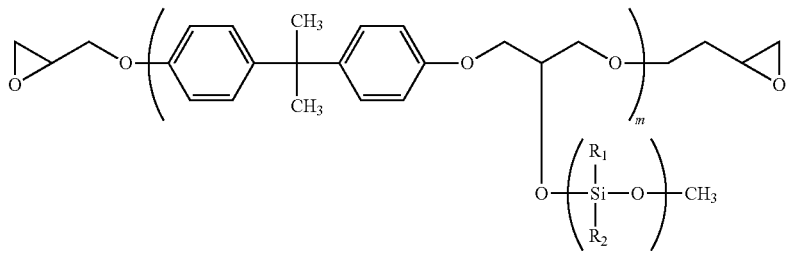

In the above chemical formula, $R_1$ is a hydrogen atom or a C1~C5 alkyl group, $R_2$ is a hydrogen atom, a C1~C5 alkoxy group or a C1~C5 alkyl group, and m is an integer of 1 to 10.

<Chemical Formula 2>

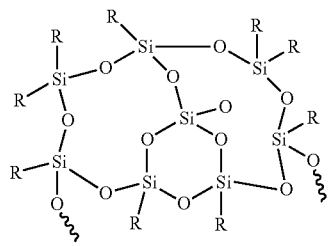

(wherein R is at least one selected from the group consisting of a hydrogen atom, a C1~C10 alkyl group, an alkoxy group, an epoxy group and a hydroxyl group. That is, R may be randomly selected from the group consisting of a hydrogen atom, a C1~C10 alkyl group, an alkoxy group, an epoxy group and a hydroxyl group.)

Specific examples of the alkyl group include a methyl group, an ethyl group, a propyl group, a butyl group, a sec-butyl group, a tert-butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a heneicosyl group, a docosyl group, etc.

Specific examples of the alkoxy group include methoxy, ethoxy, propoxy, isopropoxy, butoxy, tert-butoxy, isobutoxy, pentoxy, hexoxy, etc.

The compound represented by Chemical Formula 1 has an epoxy group as shown in Chemical Formula 1 and thus has an epoxy equivalent. The term the epoxy equivalent means an equivalent (g/eq) of a single epoxy group and a value obtained by dividing the average molecular weight by the number of epoxy groups per molecule.

The compound represented by Chemical Formula 1 has an epoxy equivalent of 500~2000 g/eq. The case where the epoxy equivalent falls in the above range may increase stability, heat resistance, flatness, adhesion, and hardness.

The amount of the compound represented by Chemical Formula 1 or the compound represented by Chemical Formula 2 contained in the photosensitive resin composition is 5~70 wt %. If the amount thereof is less than 5 wt %, heat resistance, transparency and hardness may decrease. In contrast, if the amount thereof is greater than 70 wt %, development does not occur in the developing process.

Particularly when a pattern is formed using the photosensitive resin composition for an organic insulating layer, a high top/bottom ratio is required. In the case where the compound represented by Chemical Formula 1 or the compound represented by Chemical Formula 2 is contained in the above amount in such a photosensitive resin composition, the top/bottom ratio may be effectively increased.

Concretely, the top/bottom ratio may be determined by measuring the pattern using a scanning electron microscope or a 3D profiler.

FIG. 1 illustrates the pattern measured using a 3D profiler. As illustrated in FIG. 1, the shape of the pattern is similar to a trapezoid, and a value (=a/b×100) obtained by dividing the length of bottom (b) by the length of top (a) and multiplying the resulting value by 100 is defined as a top/bottom ratio. The angle (c) defined by the base and the sides of the trapezoidal shape of the pattern is referred to as a taper angle.

Specifically, in order to increase the top/bottom ratio, the length of the top (a) of the pattern should be made the same as the length of the bottom (b) thereof. When the pattern is formed using the photosensitive composition including the compound represented by Chemical Formula 1 or the compound represented by Chemical Formula 2, the length of the top (a) becomes almost the same as the length of the bottom (b), ultimately increasing the top/bottom ratio. As the top/bottom ratio increases, the taper angle may increase.

[E] Solvent

The solvent is used to prepare the above copolymer or to maintain the solid content and viscosity of the composition. Examples of the solvent include alcohols such as methanol, ethanol, etc., ethers such as tetrahydrofuran, diethyleneglycol dimethylether, diethyleneglycol diethylether, etc., and propyleneglycol alkyl ether acetates such as propyleneglycol methyl ether acetate, propyleneglycol ethyl ether acetate, propyleneglycol propyl ether acetate, propyleneglycol butyl ether acetate, etc. Among these, in order to ensure solubility, reactivity with respective components, and easiness of formation of a coating layer, particularly useful are diethyleneglycol dimethylether, diethyleneglycol diethylether, propyleneglycol methylether acetate, ketones such as methylethylketone, cyclohexanone, 4-hydroxy-4-methyl-2-pentanone, etc., esters, including methylester, ethylester, propylester and butylester of acetic acid, ethylester and methylester of 2-hydroxypropionic acid, ethylester of 2-hydroxy-2-methylpropionic acid, methylester, ethylester and butylester of hydroxyacetic acid, lactic acid ethyl, lactic acid propyl, lactic acid butyl, methylester, ethylester, propylester and butylester of methoxyacetic acid, methylester, ethylester, propylester and butylester of propoxyacetic acid, methylester, ethylester, propylester and butylester of butoxyacetic acid, methylester, ethylester, propylester and butylester of 2-methoxypropionic acid, methylester, ethylester, propylester and butylester of 2-ethoxypropionic acid, methylester, ethylester, propylester and butylester of 2-butoxypropionic acid, methylester, ethylester, propylester and butylester of 3-methoxypropane, methylester, ethylester, propylester and butylester of 3-ethoxypropionic acid, methylester, ethylester, propylester and butylester of 3-butoxypropionic acid, etc.

The above solvent may be used together with a high-boiling-point solvent. Examples of the high-boiling-point solvent include N-methyl formamide, N,N-dimethylformamide, N-methylacetamide, N,N-dimethylacetamide, N-methylpyrrolidone, dimethylsulfoxide, and benzlyethylether.

The solvent is contained in an amount of 14~80 wt % in the photosensitive resin composition. The case where the amount of the solvent falls in the above range may achieve the desired coating effects.

The photosensitive resin composition including the above components preferably has a viscosity of 2~35 cps. The viscosity is adjusted by the amounts of the components mentioned above, namely, the amounts of [A] the alkali-soluble resin, [B] the acrylic monomer having the ethylenically unsaturated bond, [C] the photopolymerization initiator and [D] the compound represented by Chemical Formula 1 or the compound represented by Chemical Formula 2 and the amount of [E] the solvent. In the case where the viscosity of the photosensitive resin composition falls in the above range, a desired coating thickness may be obtained using a spin coater or a spinless coater. Concretely, the viscosity may vary depending on the properties of the added components even when the solvent is used in the same amount, and the viscosity is determined by the film thickness. As the thickness of a film to be formed increases, the viscosity increases. In the case of a spin coater or a spinless coater, the film thickness may be formed taking into consideration all of the viscosity and the amounts of the components. Thus, when the viscosity falls in the above range, a desired film thickness may be obtained upon using a spin coater or a spinless coater.

Also, the photosensitive resin composition according to the present invention may further include an additive, as well as the above components.

The additive may include a surfactant which enhances coatability. The surfactant may include fluorine and silicon based surfactants, and examples thereof include FC-129, FC-170C, FC-430, available from 3M, F-172, F-173, F-183, F-470, F-475, available from DIC, KP322, KP323, KP340, KP341, available from Shin-Etsu Silicone, etc. Such a surfactant may be added in an amount of 5 parts by weight or less and preferably 2 parts by weight or less based on 100 parts by weight of [A] the alkali-soluble resin. If the amount of the surfactant is greater than 5 parts by weight, foam may be generated upon coating, which undesirably affects developability and surface tension.

An adhesive adjuvant may also be added to increase adhesion to a gas. The adhesive adjuvant preferably includes a functional silane coupling agent, and examples thereof include trimethoxysilyl benzoic acid, -methacryloxypropyltrimethoxysilane, vinyltriacetoxysilane, vinyltrimethoxysilane, -isocyanatepropyltriethoxysilane, -glycidoxypropyltrimethoxysilane, etc. Such an adhesive adjuvant may be added in an amount of 20 parts by weight or less and preferably 10 parts by weight or less based on 100 parts by weight of [A] the alkali-soluble resin. If the amount of the adhesive adjuvant is greater than 20 parts by weight, heat resistance may deteriorate.

In addition, the present invention provides an organic insulating layer which is obtained from the above photosensitive resin composition.

The organic insulating layer may be provided via a typical formation method using the photosensitive resin composition of the invention.

In addition, the present invention provides a display device which may be manufactured using the organic insulating layer via a typical manufacturing method.

MODE FOR INVENTION

A better understanding of the present invention may be obtained through the following examples and comparative examples which are set forth to illustrate, but are not to be construed as limiting the present invention.

Preparative Example 1

Preparation of Alkali-Soluble Resin A 10 parts by weight of 2,2'-azobis isobutyronitrile as a photopolymerization initiator was dissolved in 200 parts by weight of a propyleneglycol monomethylether acetate solvent in a reactor provided with a condenser and a stirrer. Subsequently, 65 parts by weight of styrene, 15 parts by weight, of methacrylic acid, and 20 parts by weight of methacrylic acid glycidyl were added, purged with nitrogen, and then mildly stirred. The temperature of the solution was increased to 70, and this temperature was maintained for 4 hr, yielding a polymer solution containing a copolymer. The solid content of the obtained polymer solution was 35 wt %.

Preparative Example 2

Preparation of Alkali-Soluble Resin B

A polymer solution was prepared in the same manner as in Preparative Example 1, with the exception that 45 parts by weight styrene and 20 parts by weight of dicyclopentenyl acrylate were used instead of 65 parts by weight of styrene. The solid content of the obtained polymer solution was 33 wt %

Examples 1 to 5 and Comparative Examples 1 and 2

Alkali-soluble resins A and B as photosensitive materials, propyleneglycol monomethylether acetate as a solvent, OXE-01 (available from CIBA) as a photopolymerization initiator, and dipentaerythritol hexa(meth)acrylate as an acrylic monomer having an ethylenically unsaturated bond were mixed together, after which a compound represented by Chemical Formula 1 ($R_1$ is a methyl group, $R_2$ is a methoxy group, m is 3) was added thereto in an amount shown in Table 1 below, thus preparing photosensitive resins. In Table 1, the unit of the amount is wt %.

TABLE 1

| | Alkali-soluble resin A | Alkali-soluble resin B | Acrylic Monomer having Ethylenically Unsaturated Bond | Compound of Chemical Formula 1 | Photo-polymer-ization initiator | Solvent |
|---|---|---|---|---|---|---|
| Ex. 1 | 9 | 0 | 15 | 5 | 1 | 70 |
| Ex. 2 | 9 | 0 | 10 | 10 | 1 | 70 |
| Ex. 3 | 9 | 0 | 5 | 15 | 1 | 70 |
| Ex. 4 | 0 | 9 | 10 | 10 | 1 | 70 |
| Ex. 5 | 0 | 9 | 5 | 15 | 1 | 70 |
| C. Ex. 1 | 9 | 0 | 20 | 0 | 1 | 70 |
| C. Ex. 2 | 0 | 9 | 20 | 0 | 1 | 70 |

The properties of the compositions of Examples 1 to 5 and Comparative Examples 1 and 2 were evaluated as follows. The results are shown in Table 3 below.

Examples 6 to 10 and Comparative Examples 1 and 2

Alkali-soluble resins A and B as photosensitive materials, propyleneglycol monomethylether acetate as a solvent, OXE-01 (available from CIBA) as a photopolymerization initiator, and dipentaerythritol hexa(meth)acrylate as an acrylic monomer having an ethylenically unsaturated bond were mixed together, after which a compound represented by Chemical Formula 2 (R has an epoxy group, a methoxy group, a hydroxyl group, a methyl group) was added thereto in an amount shown in Table 2 below, thus preparing photosensitive resins. In Table 2, the unit of the amount is wt %.

TABLE 2

| | Alkali-soluble resin A | Alkali-soluble resin B | Acrylic Monomer having Ethylenically Unsaturated Bond | Compound of Chemical Formula 2 | Photo-polymer-ization initiator | Solvent |
|---|---|---|---|---|---|---|
| Ex. 6 | 9 | 0 | 15 | 5 | 1 | 70 |
| Ex. 7 | 9 | 0 | 10 | 10 | 1 | 70 |
| Ex. 8 | 9 | 0 | 5 | 15 | 1 | 70 |

TABLE 2-continued

|  | Alkali-soluble resin A | Alkali-soluble resin B | Acrylic Monomer having Ethylenically Unsaturated Bond | Compound of Chemical Formula 2 | Photo-polymer-ization initiator | Sol-vent |
|---|---|---|---|---|---|---|
| Ex. 9 | 0 | 9 | 10 | 10 | 1 | 70 |
| Ex. 10 | 0 | 9 | 5 | 15 | 1 | 70 |
| C. Ex. 1 | 9 | 0 | 20 | 0 | 1 | 70 |
| C. Ex. 2 | 0 | 9 | 20 | 0 | 1 | 70 |

The properties of the compositions of Examples 6 to 10 and Comparative Examples 1 and 2 were evaluated as follows. The results are shown in Table 4 below.

(1) Viscosity

Viscosity was measured using a Brookfield viscometer at 25.

(2) Remaining Rate

Each photosensitive resin composition was applied on a glass substrate using spin coating, and pre-dried on a hot plate at 100 for 85 sec, thus forming a photoresist film having a thickness of 2 μm. The glass substrate having such a film was photo-exposed, developed in a 0.04% KOH aqueous solution for 60 sec, and intensively heat-treated at 220 for 30 min.

The thickness of the film upon pre-drying and the thickness of the film formed after removal of the solvent via post-curing were measured and the ratio of thicknesses was calculated, thus determining the remaining rate.

(3) Flatness

Each photosensitive resin composition was applied on a glass substrate having a color resist pattern using spin coating, and pre-dried on a hot plate at 100 for 85 sec, thus forming a photoresist film having a thickness of 2 μm. The glass substrate having such a film was photo-exposed, developed in a 0.04% KOH aqueous solution for 60 sec, and intensively heat-treated at 220 for 30 min. The thicknesses at five points of the dried coating film thus obtained were measured and thus flatness was determined. The case where the resulting thickness deviation is less than 0.025 is represented by ⊚, the case where the thickness deviation is 0.026~0.05 is represented by ○, the case where the thickness deviation is 0.06~0.1 is represented by Δ, and the case where the thickness deviation is greater than 0.1 is represented by x.

(4) Sensitivity

Each photosensitive resin composition was applied at spin rate of 500 rpm on a glass substrate, pre-dried on a hot plate at 100 for 85 sec, photo-exposed at an exposure dose of 60 mJ/, 70 mJ/, 80 mJ/, 90 mJ/, 100 mJ/, 150 mJ/, and 200 mJ/, developed in a 0.04% KOH aqueous solution for 60 sec, and then intensively heat-treated at 220 for 30 min. The thicknesses of the resulting coating films were measured. In the case where the measured thickness is 90% or more of the thickness of the coating film obtained at 200 mJ/, the corresponding value was selected as sensitivity in each composition.

(5) Heat Resistance

The widths of top, bottom, right and left of the pattern film formed in the sensitivity measurement were measured. The case where a change in angle is 0~10% compared to before baking (250, 30 min) is represented by ⊚, the case where such a change is 11~20% is represented by ○, the case where such a change is 21~40% is represented by Δ, and the case where such a change is greater than 40% is represented by x.

(6) Adhesion

Each photosensitive resin composition was applied on a glass substrate using spin coating, pre-dried on a hot plate at 100 for 85 sec, photo-exposed at an exposure dose of 60 mJ/, 70 mJ/, 80 mJ/, 90 mJ/, 100 mJ/, 150 mJ/, and 200 mJ/, developed in a 0.04% KOH aqueous solution for 60 sec, and then intensively heat-treated at 220 for 1 hr. The obtained coating film was cut into 100 pieces, after which a 3M scotch magic tape was attached thereto and then detached therefrom. Then, the number of remaining coating film pieces was counted. The case where 100% of the coating film remained is represented by ⊚, the case where 90~99% of the coating film remained is represented by ○, the case where 80~89% of the coating film remained is represented by Δ, and the case where less than 80% of the coating film remained is represented by x.

(7) Top/Bottom Ratio

Each photosensitive resin composition was applied on a glass substrate using spin coating, pre-dried on a hot plate at 100 for 85 sec, photo-exposed at an exposure dose of 40, 60, 70, 80, 90, 100, 150, and 200 mJ/using a 40 μm pattern mask, developed in a 0.04% KOH aqueous solution for 60 sec, and then intensively heat-treated at 220 for 30 min. The CD sizes of the top and the bottom of the formed pattern were measured using a 3D profiler.

(8) Transmittance

Transmittance was measured at 400 nm using a spectrophotometer.

TABLE 3

|  | Viscosity (cps) | Flatness | Sensitivity (mJ/cm$^2$) | Heat Resistance | Adhesion | Remaining Rate (%) | Transmittance (%) | T/B Ratio (%) |
|---|---|---|---|---|---|---|---|---|
| Ex. 1 | 5 | ○ | 60 | ○ | ○ | 90 | 93 | 84.4 |
| Ex. 2 | 5 | ○ | 60 | ○ | ⊚ | 91.7 | 94.3 | 86.7 |
| Ex. 3 | 5 | ○ | 60 | ○ | ⊚ | 92.4 | 95.5 | 88.6 |
| Ex. 4 | 5 | ○ | 60 | ⊚ | ○ | 92.2 | 97.2 | 88.2 |
| Ex. 5 | 5 | ○ | 60 | ⊚ | ○ | 93.0 | 98.1 | 90.4 |
| C. Ex. 1 | 5 | ○ | 60 | X | Δ | 87.8 | 88.0 | 75.0 |
| C. Ex. 2 | 5 | ○ | 70 | Δ | Δ | 88.5 | 89.0 | 76.1 |

TABLE 4

|  | Viscosity (cps) | Flatness | Sensitivity (mJ/cm$^2$) | Heat Resistance | Adhesion | Remaining Rate (%) | Transmittance (%) | T/B Ratio (%) |
|---|---|---|---|---|---|---|---|---|
| Ex. 6 | 5 | ○ | 50 | ○ | ○ | 90.3 | 91.5 | 82.1 |
| Ex. 7 | 5 | ○ | 50 | ○ | ⊚ | 91.0 | 95.0 | 86.7 |
| Ex. 8 | 5 | ○ | 50 | ○ | ⊚ | 92.6 | 97.6 | 90.8 |

TABLE 4-continued

|  | Viscosity (cps) | Flatness | Sensitivity (mJ/cm²) | Heat Resistance | Adhesion | Remaining Rate (%) | Transmittance (%) | T/B Ratio (%) |
|---|---|---|---|---|---|---|---|---|
| Ex. 9 | 5 | ○ | 50 | ◎ | ○ | 91.3 | 97.2 | 87.4 |
| Ex. 10 | 5 | ○ | 50 | ◎ | ◎ | 92.7 | 98.2 | 91.2 |
| C. Ex. 1 | 5 | ○ | 60 | X | Δ | 87.8 | 88.0 | 75.0 |
| C. Ex. 2 | 5 | ○ | 70 | Δ | Δ | 88.5 | 89.0 | 76.1 |

As is apparent from Tables 3 and 4, the photosensitive resin compositions of Examples 1 to 5, and Examples 6 to 10 were superior in terms of heat resistance, adhesion, remaining rate and transmittance. In particular, the taper angle and patternability became better in proportion to an increase in the top/bottom ratio. Thus, these photosensitive resin compositions can be effectively applied to an organic insulating layer in a variety of display processes.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

According to the present invention, a photosensitive resin composition can be useful in an organic insulating layer.

The invention claimed is:

1. A photosensitive resin composition, comprising (A) an alkali-soluble resin, (B) an acrylic monomer having an ethylenically unsaturated bond, (C) a photopolymerization initiator, (D) a compound represented by Chemical Formula 1 below and (E) a solvent, <Chemical Formula 1>

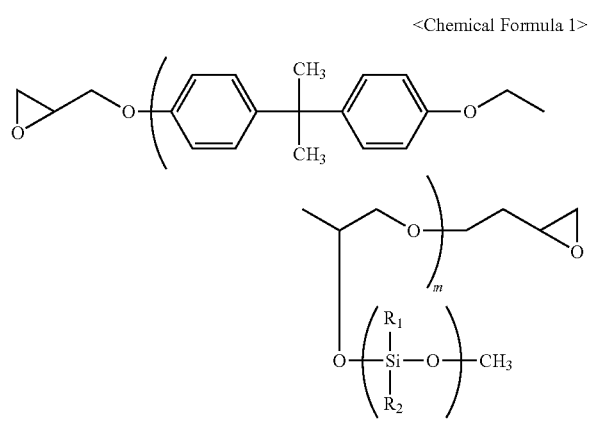

wherein $R_1$ is a hydrogen atom or a C1~C5 alkyl group, $R_2$ is a hydrogen atom, a C1~C5 alkoxy group or a C1~C5 alkyl group, and m is an integer of 1 to 10.

2. The photosensitive resin composition of claim 1, wherein (D) the compound represented by Chemical Formula 1 has an epoxy equivalent of 500~2000 g/eq.

3. The photosensitive resin composition of claim 1, comprising (A) 5~60 wt % of the alkali-soluble resin, (B) 5~70 wt % of the acrylic monomer having the ethylenically unsaturated bond, (C) 0.5~20 wt % of the photopolymerization initiator, (D) 5~70 wt % of the compound represented by Chemical Formula 1 and (E) 14~80 wt % of the solvent.

4. The photosensitive resin composition of claim 1, wherein (A) the alkali-soluble resin is a copolymer of (a1) one or a mixture of two or more selected from among unsaturated carboxylic acid and unsaturated carboxylic anhydride; and (a2) an epoxy-containing unsaturated compound, or is a copolymer of (a1) one or a mixture of two or more selected from among unsaturated carboxylic acid and unsaturated carboxylic anhydride; (a2) an epoxy-containing unsaturated compound; and one or more selected from among (a3) an olefinic unsaturated carboxylic acid ester compound other than the (a1) and (a2), and (a4) an olefinic unsaturated compound other than the (a1), (a2), and (a3).

5. The photosensitive resin composition of claim 4, wherein a weight ratio of (a1) the one or the mixture of two or more selected from among unsaturated carboxylic acid and unsaturated carboxylic anhydride and (a2) the epoxy-containing unsaturated compound of (A) the alkali-soluble resin is 1:1.3~2.5.

6. The photosensitive resin composition of claim 4, wherein when (A) the alkali-soluble resin is a copolymer of (a1) the one or the mixture of two or more selected from among unsaturated carboxylic acid and unsaturated carboxylic anhydride; (a2) the epoxy-containing unsaturated compound; and one or more selected from among (a3) the olefinic unsaturated carboxylic acid ester compound other than the (a1) and (a2), and (a4) the olefinic unsaturated compound other than the (a1), (a2), and (a3), (A) the alkali-soluble resin includes 20~65 wt % of the one or more selected from among (a3) the olefinic unsaturated carboxylic acid ester compound other than the (a1) and (a2), and (a4) the olefinic unsaturated compound other than the (a1), (a2), and (a3).

7. The photosensitive resin composition of claim 1, which has a viscosity of 2~35 cps.

8. An organic insulating layer, obtained from the photosensitive resin composition of claim 1.

9. A display device, comprising the organic insulating layer of claim 8.

10. An organic insulating layer, obtained from the photosensitive resin composition of claim 2.

11. An organic insulating layer, obtained from the photosensitive resin composition of claim 3.

12. An organic insulating layer, obtained from the photosensitive resin composition of claim 4.

13. An organic insulating layer, obtained from the photosensitive resin composition of claim 5.

14. An organic insulating layer, obtained from the photosensitive resin composition of claim 6.

15. An organic insulating layer, obtained from the photosensitive resin composition of claim 7.

* * * * *